US012618880B2

(12) United States Patent
Norouzpourshirazi et al.

(10) Patent No.: US 12,618,880 B2
(45) Date of Patent: May 5, 2026

(54) ULTRA-LOW-POWER FRONT END FOR BEYOND-THE-RAILS VOLTAGE SENSING

(71) Applicant: Cirrus Logic International Semiconductor Ltd., Edinburgh (GB)

(72) Inventors: Arashk Norouzpourshirazi, Austin, TX (US); Stephen T. Hodapp, Austin, TX (US); Ravi K. Kummaraguntla, Austin, TX (US); Axel Thomsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 474 days.

(21) Appl. No.: 17/884,753

(22) Filed: Aug. 10, 2022

(65) Prior Publication Data

US 2024/0053387 A1 Feb. 15, 2024

(51) Int. Cl.
*G01R 19/25* (2006.01)
(52) U.S. Cl.
CPC ............................... *G01R 19/2506* (2013.01)
(58) Field of Classification Search
CPC G01R 19/25; G01R 19/2506; G01R 19/0053; H03M 1/1245; H03M 1/12; H03M 1/403; H03M 1/442; H03M 1/446; H03M 3/494; H03K 17/063
See application file for complete search history.

(56) References Cited

U.S. PATENT DOCUMENTS

| | | | |
|---|---|---|---|
| 6,437,724 B1 | 8/2002 | Nagaraj | |
| 7,289,054 B1 * | 10/2007 | Watanabe | H03M 3/35 |
| | | | 341/143 |
| 2006/0238270 A1 * | 10/2006 | Rostami | H01P 1/22 |
| | | | 333/81 R |
| 2015/0109161 A1 | 4/2015 | Trampitsch | |
| 2019/0181697 A1 * | 6/2019 | Malkin | H02J 50/12 |
| 2024/0048108 A1 | 2/2024 | Norouzpourshirazi et al. | |

OTHER PUBLICATIONS

Combined Search and Examination Report under Sections 17 and 18(3), UKIPO, Application No. GB2302616.4, mailed Aug. 18, 2023.
Examination Report under Section 18(3), UKIPO, Application No. GB2302616.4, mailed May 20, 2024.

* cited by examiner

*Primary Examiner* — Son T Le
(74) *Attorney, Agent, or Firm* — Jackson Walker L.L.P.

(57) ABSTRACT

A system may include a passive floating attenuator configured to receive an analog physical quantity and attenuate the analog physical quantity to a floating attenuated signal defined by voltage nodes other than the voltage nodes of the analog physical quantity, an anti-aliasing filter configured to filter the floating attenuated signal to generate a filtered attenuated signal, and a switched-capacitor sampling circuit comprising a plurality of switches configured to sample the filtered attenuated signal.

14 Claims, 2 Drawing Sheets

ULTRA-LOW-POWER FRONT END FOR BEYOND-THE-RAILS VOLTAGE SENSING

FIELD OF DISCLOSURE

The present disclosure relates in general to methods and systems for implementing an analog front end for voltage sensing configured to sense input signals higher in magnitude than available supply rails.

BACKGROUND

Delta-sigma modulators are typically used in electronic circuits such as analog-to-digital converters (ADCs). Often, such ADCs employ an anti-aliasing filter to filter an analog input signal that may be sampled by a sampling network at the input of the delta-sigma modulator for conversion into an equivalent digital signal by the ADC. An example of such a sampling network is a switched capacitor circuit.

As in many applications, it may be desirable to minimize power consumption in ADCs and other circuits, especially as ADCs may be used in battery-operated devices such as smartphones and tablets. Traditional sensing of a voltage prior to conversion by an ADC involves a continuous-time analog front end to attenuate and low-pass filter the sensed voltage prior to digitizing the signal by the ADC. However, a continuous-time analog front end inherently consumes static power, which makes a continuous-time analog front end an unsuitable choice for ultra-low power consumption.

SUMMARY

In accordance with the teachings of the present disclosure, the disadvantages and problems associated with existing approaches for implementing analog front ends may be reduced or eliminated.

In accordance with embodiments of the present disclosure, a system may include a passive floating attenuator configured to receive an analog physical quantity and attenuate the analog physical quantity to a floating attenuated signal defined by voltage nodes other than the voltage nodes of the analog physical quantity, an anti-aliasing filter configured to filter the floating attenuated signal to generate a filtered attenuated signal, and a switched-capacitor sampling circuit comprising a plurality of switches configured to sample the filtered attenuated signal.

In accordance with these and other embodiments of the present disclosure, a method may include attenuating, with a passive floating attenuator, an analog physical quantity to a floating attenuated signal defined by voltage nodes other than the voltage nodes of the analog physical quantity. The method may also include filtering, with an anti-aliasing filter, the floating attenuated signal to generate a filtered attenuated signal. The method may additionally include sampling the filtered attenuated signal with a switched-capacitor sampling circuit comprising a plurality of switches.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
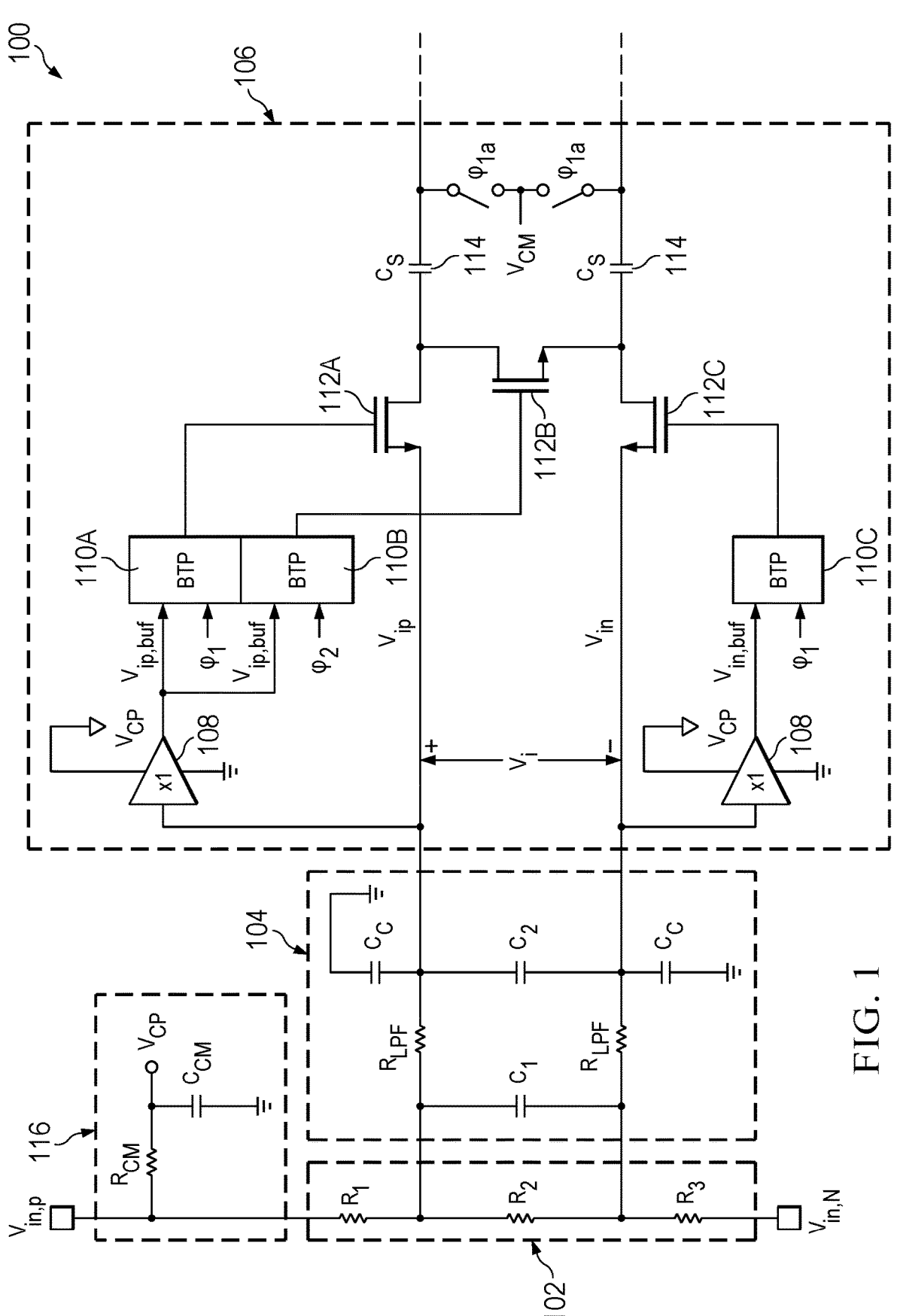
FIG. 1 illustrates a circuit diagram of an example analog front end, in accordance with embodiments of the present disclosure.

FIG. 1 illustrates a circuit diagram of an example analog front end 100, in accordance with embodiments of the present disclosure. As shown in FIG. 1, analog front end 100 may include a floating attenuator 102, passive anti-aliasing filter 104, and a common-mode insensitive sampling circuit 106.

Floating attenuator 102 may include any suitable system, device, or apparatus configured to receive a differential input voltage $V_{in,diff}=V_{in,p}-V_{in,n}$ and attenuate such voltage to generate an attenuated voltage smaller than differential input voltage $V_{in,diff}$ and such that the attenuated voltage is "floating" in the sense that the attenuated voltage is formed between two electrical nodes other than voltage nodes of differential input voltage $V_{in,diff}$, and that the common-mode of the attenuated voltage may be dependent on the magnitude of differential input voltage $V_{in,diff}$ and/or individual input voltages thereof. For example, as shown in FIG. 1, floating attenuator 102 may be implemented using a resistor divider of three series resistors having resistances $R_1$, $R_2$, and $R_3$, such that the attenuated voltage is equal to $$\frac{R_2}{R_1+R_2+R_3}V_{Cell}.$$

Floating attenuation of differential input voltage $V_{in,diff}$ may minimize resistor-induced non-linearity of a resistor divider used for attenuation.

Passive anti-aliasing filter 104 may include any suitable system, device, or apparatus configured to perform signal anti-aliasing upon the attenuated voltage in order to generate a filtered attenuated signal $V_i=V_{ip}-V_{in}$. In some embodiments, passive anti-aliasing filter 104 may be implemented fully on the same integrated circuit as the ADC that follows analog front end 100. Further, although passive anti-aliasing filter 104 is shown in FIG. 1 as a fourth-order resistive-capacitive filter, it is understood that passive anti-aliasing filter 104 may be implemented using a filter of any suitable order and may be implemented with any suitable number and type of passive circuit components (e.g., resistances, capacitances, and inductances).

Common-mode insensitive sampling circuit 106 may comprise any suitable common-mode insensitive circuit that is insensitive to a common-mode voltage present in the attenuated voltage and filtered attenuated signal $V_i$. In some embodiments, common-mode insensitive sampling circuit 106 may enable beyond-the-rails sensing of a filtered attenuated signal V, greater in magnitude than the available voltage supply rails of analog front end 100, or wherein one or both component voltages $V_{ip}$ and $V_{in}$ of filtered attenuated signal $V_i$ is greater in magnitude than an available voltage supply rail of analog front end 100. As shown in FIG. 1, common-mode insensitive sampling circuit 106 may include floating buffers 108, bootstrap generation circuits 110 (e.g., bootstrap generation circuits 110A, 110B, and 110C), signal switches 112 (e.g., signal switches 112A, 112B, and 112C) and sampling capacitors 114.

A floating buffer 108 may comprise an ultra-low-power unity-gain buffer that tracks the outputs of passive anti-aliasing filter 104 in order to drive a bootstrap generation circuit 110 with a bootstrapped input signal $V_{i,buf}$, wherein a bootstrapped input signal $V_{i,buf}$ may include positive bootstrapped input signal $V_{ip,buf}$ driven to bootstrap generation circuits 110A and 110B or may include negative bootstrapped input signal $V_{in,buf}$ driven to bootstrap generation circuit 110C. Each floating buffer 108 may be powered from a floating supply voltage $V_{cp}$ generated from a replica filter 116 coupled to positive input node $V_{Cell,P}$, wherein replica filter 116 may be a first-order approximation of passive anti-aliasing filter 104. In operation, each floating buffer 108 may serve to electrically isolate bootstrap generation circuits 110 from the output of passive anti-aliasing filter 104 to prevent asymmetric loading on the outputs of passive anti-aliasing filter 104. Symmetric loading on the outputs of passive anti-aliasing filter 104 may enable highly-linear sampling and high common-mode rejection.

Figure 2:
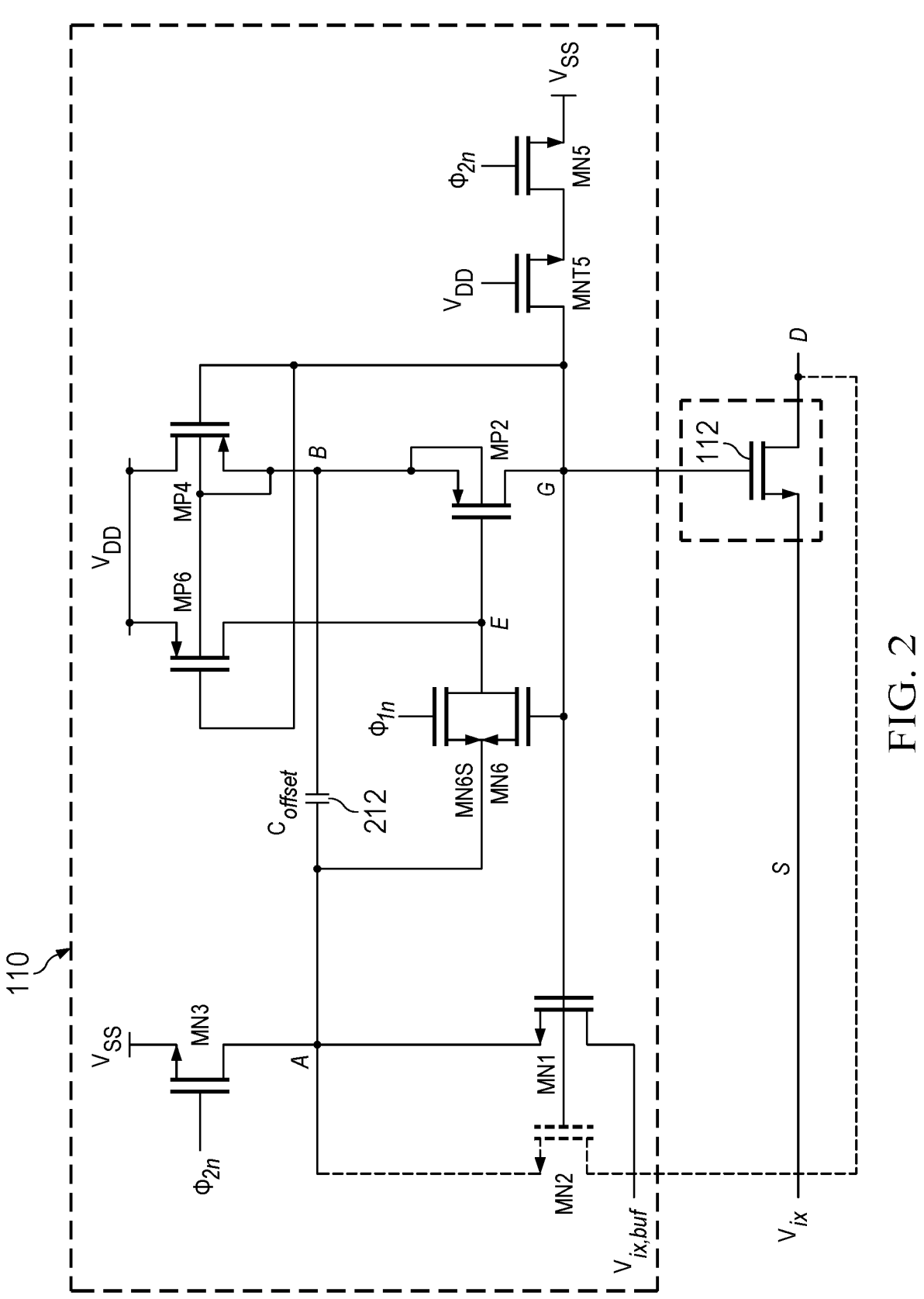
FIG. 2 illustrates a circuit diagram of an example transistor-level implementation of a bootstrap generation circuit, in accordance with embodiments of the present disclosure.

A bootstrap generation circuit 110 may enable a "beyond the rails" bootstrapped signal switch 112 for highly linear sampling of signals $v_{ip}$ and $v_{in}$ higher in magnitude than the supply rails available to analog front end 100. FIG. 2 illustrates a circuit diagram of an example transistor-level implementation of a bootstrap generation circuit 110 coupled to a signal switch 112, in accordance with embodiments of the present disclosure.

Signal switch 112 may be implemented as an n-type field-effect transistor, and may be configured to, during a sampling phase $\phi_1$, sample an input signal $v_{ix}$ (e.g., $v_{ip}$ or $v_{in}$) present at a source terminal of signal switch 112 onto a drain terminal of signal switch 112, which may in turn be coupled to a delta-sigma modulator, ADC, and/or other electronic circuit.

Bootstrap generation circuit 110 may comprise field-effect transistors MN1, MP2, MN2, MN3, MP4, MN5, MNT5, MN6, MN6S, and MP6 and a bootstrap capacitor 212 having a capacitance $C_{offset}$. Low voltage operation in switched capacitor circuits may be achieved by using a special low-voltage bootstrapped switch implemented by the combination of signal switch 112 and bootstrap generation circuit 110.

During a bootstrap phase $\phi_2$, charging switches implemented by n-type transistor MN3 and p-type transistor MP4 may charge bootstrap capacitor 212 to a rail voltage $V_{DD}$ while a switch implemented by n-type transistor MN5 couples a gate terminal voltage of signal switch 112 to rail voltage $V_{SS}$ (e.g., ground voltage). During a sampling phase $\phi_1$, switches implemented by n-type transistor MN1 and p-type transistor MP2 may couple precharged bootstrap capacitor 212 between a gate terminal and a source terminal of signal switch 112 such that its gate-source voltage $V_{GS}$ is equal to a voltage $V_C$ ($V_C \approx V_{DD}$) across bootstrap capacitor 212. Such switch configuration may allow rail-to-signal switching because gate-source voltage $V_{GS}$ may remain constant during sampling phase $\phi_1$ independently of an input signal $v_{ix}$ to be passed through signal switch 112 to a drain terminal of signal switch 112.

Gate terminal connections of each of transistor MP2 and transistor MP4 may prevent their overstress as a voltage on node B (e.g., at one terminal of bootstrap capacitor 212) rises above rail voltage $V_{DD}$. N-type transistor MN6S may trigger transistor MP2 on at the beginning of sampling phase $\phi_1$ while n-type transistor MN6 may keep transistor MP2 on while the voltage on node A (e.g., at another terminal of bootstrap capacitor 212) rises to the buffered input voltage $v_{ix,buf}$ (e.g., $v_{ip,buf}$ or $v_{in,buf}$) Gate terminals of transistors MN1 and MN6 may be coupled to the gate terminal of signal switch 112, thus allowing transistors MN1 and MN6 to be turned on similar to that of signal switch 112. Further, n-type transistor MNT5 may prevent a gate-drain voltage of transistor MN5 from exceeding rail voltage $V_{DD}$ while transistor MN5 is turned off during sampling phase $\phi_1$. During sampling phase $\phi_1$ when transistor MNT5 is turned off, its drain-bulk diode junction voltage may reach a reverse bias of $2V_{DD}$. Further, the bulk of transistors MP2 and MP4 are coupled to the node of highest potential in bootstrapped switch circuit 1, i.e., node B, and not coupled to rail voltage $V_{DD}$.

P-type transistor MP6 may be configured to decouple bootstrap capacitor 212 during a bootstrap phase $\phi_2$, by biasing the gate terminal of p-type transistor MP2 to rail voltage $V_{DD}$ while the source terminal of p-type transistor MP2 is also biased to the same rail voltage $V_{DD}$ by p-type transistor MP4. P-type transistor MP6, with its bulk coupled to rail voltage $V_{DD}$, may be turned off by phase signal $\phi_{2p}$ when the bootstrap phase ends. In addition, the bulk of transistor MP6 may be coupled to node B, the node of bootstrap generation circuit 110 that may have the highest voltage potential, such that the bulk of transistor MP6 is coupled to a terminal of bootstrap capacitor 212. Further, the gate terminal of transistor MP6 may be coupled to the gate terminal of signal switch 112. As a result, bootstrap generation circuit 110 may enable a "beyond the rails" bootstrapped switch for highly linear sampling of input signals $v_{in}$ higher in magnitude than the supply rails $V_{DD}$ and $V_{SS}$.

In addition, bootstrap generation circuit 110 may enable over-voltage protection, as a p-type field-effect transistor (e.g., transistor MP6) configured for biasing bootstrap capacitor 212 during bootstrap phase $\phi_2$ (e.g., when signal switch 112 is off), and may have its gate terminal protected from over-voltage by a bootstrapped clock signal also received by the gate terminal of signal switch 112. Further, a p-type field-effect transistor (e.g., transistor MP6) configured for biasing bootstrap capacitor 212 during bootstrap phase $\phi_2$ (e.g., when signal switch 112 is off) may have its bulk protected from over-voltage by a voltage present at a terminal of the bootstrap capacitor, wherein such voltage present at such terminal of the bootstrap capacitor 212 may be the highest voltage potential present in bootstrap generation circuit 110 in all relevant operational states of bootstrap generation circuit 110.

For proper operation, the voltage at the drain side of signal switch 112 must always be higher than that at the source side at the moment of switching in order to prevent the drain—gate voltage of signal switch 112 from exceeding rail voltage $V_{DD}$ during the turn-on transient of signal switch 112. In order to ensure this condition, an additional transistor MN2 may be coupled between node A and the drain terminal of signal switch 112, with the gate terminal of transistor MN2 coupled to the gate terminal of signal switch 112, such that signal switch 112 becomes completely symmetrical. The gate terminal voltage of signal switch 112 may then be clamped at a voltage higher than the terminal of the lowest terminal voltage of signal switch 112.

The bootstrapped switch circuit shown in FIG. 2 may allow beyond-the-rails switch operation of signal switch 112 while limiting all gate-source and gate-drain voltages to rail voltage $V_{DD}$, thus minimizing oxide overstress.

Notably, the bootstrapped switch circuit shown in FIG. 2 is similar in many respects to the bootstrapped switch circuit described in U.S. patent application Ser. No. 17/881,845 filed Aug. 5, 2022 and incorporated herein in its entirety. The bootstrapped switch circuit shown in FIG. 2 may operate in a similar manner to the bootstrapped switch circuit described in U.S. patent application Ser. No. 17/881,845, except that in the present disclosure, the input to the bootstrapped switch circuit shown in FIG. 2 is split into a buffered version via buffered input voltage $v_{ix,buf}$ and an unbuffered version via input voltage $v_{ix}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:

a passive floating attenuator configured to receive an analog physical quantity and attenuate the analog physical quantity to a floating attenuated signal defined by voltage nodes other than the voltage nodes of the analog physical quantity;

an anti-aliasing filter configured to filter the floating attenuated signal to generate a filtered attenuated signal; and a switched-capacitor sampling circuit comprising a plurality of switches configured to sample the filtered attenuated signal.

2. The system of claim 1, wherein the passive floating attenuator comprises a resistive divider.

3. The system of claim 1, wherein the switched-capacitor sampling circuit comprises a common-mode insensitive sampling circuit insensitive to a common mode of the filtered attenuated signal.

4. The system of claim 1, further comprising a bootstrap generation network electrically coupled to the plurality of switches and configured to:

generate a bootstrap sampling clock for controlling the plurality of switches; and generate a floating supply voltage for the bootstrap sampling clock based on the filtered attenuated signal.

5. The system of claim 4, further comprising a unity gain buffer configured to buffer the filtered attenuated signal used for generating the bootstrap sampling clock in order to isolate an output of the anti-aliasing filter from the bootstrap generation network.

6. The system of claim 5 wherein the unity gain buffer is powered from a floating supply that is derived from and tracks a highest-voltage beyond-the-rails component of the analog physical quantity.

7. The system of claim 1, wherein the analog physical quantity is a voltage.

8. A method comprising:

attenuating, with a passive floating attenuator, an analog physical quantity to a floating attenuated signal defined by voltage nodes other than the voltage nodes of the analog physical quantity;

filtering, with an anti-aliasing filter, the floating attenuated signal to generate a filtered attenuated signal; and sampling the filtered attenuated signal with a switched-capacitor sampling circuit comprising a plurality of switches.

9. The method of claim 8, wherein the passive floating attenuator comprises a resistive divider.

10. The method of claim 8, wherein the switched-capacitor sampling circuit comprises a common-mode insensitive sampling circuit insensitive to a common mode of the filtered attenuated signal.

11. The method of claim 8, further comprising:

generating, with a bootstrap generation network electrically coupled to the plurality of switches, a bootstrap sampling clock for controlling the plurality of switches; and generating, with the bootstrap generation network, a floating supply voltage for the bootstrap sampling clock based on the filtered attenuated signal.

12. The method of claim 11, further comprising buffering, with a unity gain buffer, the filtered attenuated signal used for generating the bootstrap sampling clock in order to isolate an output of the anti-aliasing filter from the bootstrap generation network.

13. The method of claim 12, wherein the unity gain buffer is powered from a floating supply that is derived from and tracks a highest-voltage beyond-the-rails component of the analog physical quantity.

14. The method of claim 8, wherein the analog physical quantity is a voltage.

* * * * *